United States Patent
Mani (10) Patent No.: US 7,796,421 B2
(45) Date of Patent: Sep. 14, 2010

(54) PROGRAMMABLE MAGNETIC READ ONLY MEMORY (MROM)

(75) Inventor: Krishnakumar Mani, San Jose, CA (US)

(73) Assignee: MagSil Corporation, Santa Clara, CA (US)

( * ) Notice: Subject to any disclaimer, the term of this patent is extended or adjusted under 35 U.S.C. 154(b) by 190 days.

(21) Appl. No.: 12/117,561

(22) Filed: May 8, 2008

(65) Prior Publication Data

US 2008/0278996 A1    Nov. 13, 2008

Related U.S. Application Data

(60) Provisional application No. 60/916,772, filed on May 8, 2007, provisional application No. 60/938,014, filed on May 15, 2007.

(51) Int. Cl.
*G11C 11/00* (2006.01)

(52) U.S. Cl. .................. 365/158; 365/171; 365/173

(58) Field of Classification Search ................. 365/158, 365/171, 173

See application file for complete search history.

(56) References Cited

U.S. PATENT DOCUMENTS

| | | | |
|---|---|---|---|
| 7,067,866 B2 * | 6/2006 | Shi | ............................ 257/296 |
| 2006/0087879 A1 * | 4/2006 | Le Phan | ..................... 365/158 |

* cited by examiner

*Primary Examiner*—Son Dinh
(74) *Attorney, Agent, or Firm*—Hahn & Moodley LLP; Vani Moodley, Esq.

(57) ABSTRACT

In one embodiment, there is provided a method for programming a memory device having magnetoresistive memory elements as storage elements. The method is performed during fabrication of the memory device and may be used to realize a Magnetic Read Only Memory (MROM) device. In accordance with the method, during fabrication of a memory device comprising a plurality of magnetoresistive memory elements (MRME) e.g. a MTJs, the memory device is programmed by selectively controlling the presence or absence of the magnetoresistive element at each intersection of a word line (WL) and a bit line (BL) in the device.

10 Claims, 8 Drawing Sheets

PROGRAMMABLE MAGNETIC READ ONLY MEMORY (MROM)

This application claims the benefit of priority to U.S. Provisional Patent Application No. 60/916,772 filed May 8, 2007, the specification of which is hereby incorporated by reference. This application also claims the benefit of priority to U.S. Provisional Patent Application No. 60/938,014 filed May 15, 2007, the specification of which is hereby incorporated by reference.

FIELD

Embodiments of the present invention relate to solid state memories.

BACKGROUND

Magnetic memory devices use magnetic storage elements to store data rather than electric charge or current flows as is the case with electronic memory devices.

Magnetoresistance is the property of a material to change its electrical resistance under the influence of an external magnetic field. The Giant magnetoresistance (GMR) is a type of magnetoresistance that manifests as a significant change in electrical resistance in the presence of an applied magnetic field. GMR occurs in thin film structures composed of alternating ferromagnetic and non-magnetic metal layers. The tunnel magnetoresistance effect (TMR) occurs when two ferromagnets are separated by a thin (about 1 nm) insulator, in which case the resistance to a tunneling current changes with the relative orientation of the two magnetic layers. The resistance is normally higher in the anti-parallel case.

Magnetic memory devices may be fabricated in which a magnetic (hereinafter also "magnetoresistive") element defined by a thin film structure comprising ferromagnetic materials selected to have magnetoresistance (either GMR or TMR) is used to store data.

One such magnetic element is known as the Magnetic Tunnel Junction (MTJ). Fundamentally, the MTJ is a structure with a magnetic layer whose magnetization can be manipulated to store data. The MTJ may be realized as a stack comprising a pinned layer with fixed magnetism, a tunnel oxide layer and a free layer. Typically, a memory device will have millions of MTJs arranged in the grid. For illustrative purposes, FIG. 1 of the drawings shows such a grid in the form of an exemplary 3×3 grid/array 100. In the array 100, the MTJs are represented schematically by resistors 102. For writing, two orthogonal currents carried by a word line (WL) and the bit line (BL) manipulate magnetic fields in the free layer. The word lines in the grid 100 are indicated as WL0 to WL2, whereas the bit lines are indicated as BL0 to BL2. When the magnetic orientation of the free layer coincides with that of the pinned layer, tunnel resistance of the MTJ becomes low. When the direction is opposite, the resistance becomes high. Thus, a memory high or low state may be defined as high or low resistance of the MTJ.

Figure 1:
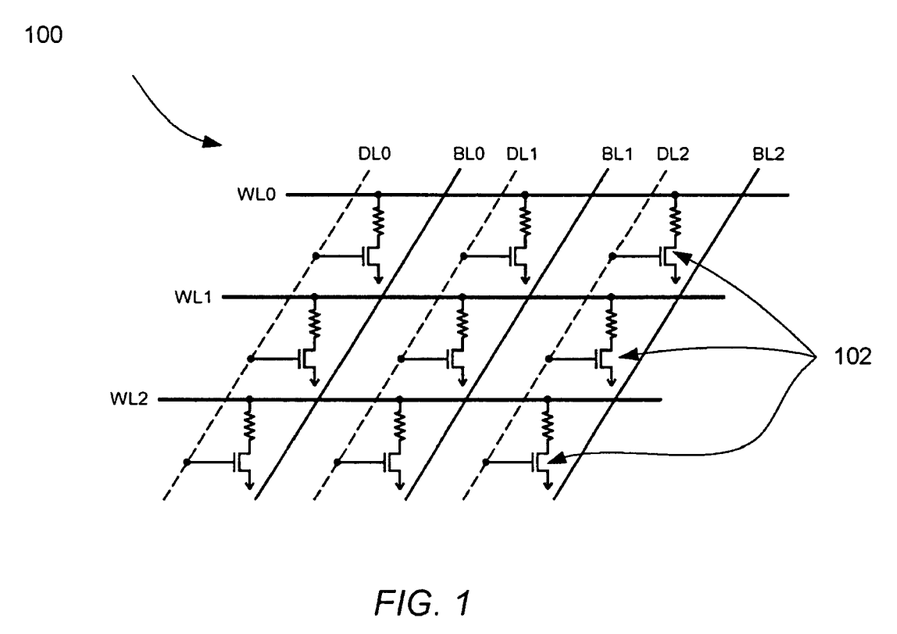
FIG. 1 shows a schematic drawing of a 3×3 memory array/device in which the basic storage element in the form of a MRME.

For reading purposes, each MTJ 102 in the grid 100 is connected to a transistor 104 which in turn is connected to a digit line (DL). In FIG. 1, the digit lines are indicated as DL0 to DL2.

SUMMARY

In one embodiment, there is provided a method for programming a memory device having magnetoresistive memory elements as storage elements. The method is performed during fabrication of the memory device and may be used to realize a Magnetic Read Only Memory (MROM) device. In accordance with the method, during fabrication of a memory device comprising a plurality of magnetoresistive memory elements (MRME) e.g. MTJs, the memory device is programmed by selectively controlling the presence or absence of the magnetoresistive element at each intersection of a word line (WL) and a bit line (BL) in the device.

The presence of a MRME at a point of intersection of a WL and a BL serves to connect the WL and the BL at that point of intersection. Since the MRME has a specific fixed resistance, the points of intersection in the grid or array where MRME is present stores a "0" or LOW logic value while the points of intersection where MRME is not present simply has insulating oxide between the WL and the BL and hence store a "1" or a HIGH logic value.

In another embodiment, there is provided a method for programming a memory device having magnetoresistive memory elements as storage elements. The method may be used to realize a Magnetic Read Only Memory (MROM) device and is performed post fabrication of the memory device. Thus, this method is referred herein as "the field-programming method". In accordance with the field-programming method, data is written to a memory array comprising a plurality on MRMEs each located at an intersection of a WL and a BL in the memory by altering the resistance of selected MRMEs. Advantageously, the MRMEs whose resistance has been altered can be sensed as a "high" corresponding to a bit with a value of "1", whereas the MRMEs whose resistance has not been altered can be sensed as a "low" corresponding to a bit with a value of "0".

To alter the resistance of the selected MRMEs, in one embodiment a voltage higher than a predefined threshold voltage is applied across the selected MRMEs. The voltage is sufficiently high to cause degradation of each selected MRME thereby altering its resistance to a new value.

Advantageously, in the case of programming errors or for other reasons, the field programming method may be repeated to re-program the memory device.

In another embodiment, there is provided a memory device comprising at least one tier structure defined by a plurality of word lines (WLs) disposed in a first direction, a plurality of (BLs) spaced from the WLs and disposed in a second direction, and a bridging structure to bridge a gap between a WL and BL where they intersect, wherein the bridging structure selectively comprises one of a MRME and an insulator according to data stored in the tier structure; and a sensing arrangement to sense the presence of the MRME at an intersection between a WL and a BL as a logical "0" and the presence of the insulator at an intersection between a WL and a BL as a logical "1".

Advantageously, the memory device may comprise several tier structures in a stacked relationship.

In a further embodiment, there is provided a memory device comprising at least one tier structure defined by plurality of word lines (WLs) disposed in a first direction, a plurality of (BLs) spaced from the WLs and disposed in a second direction, and a bridging structure to bridge a gap between a WL and BL where they intersect, wherein the bridging structure selectively comprises a MRME of a first resistance or a MRME of a second resistance; and a sensing arrangement to sense the MRMEs of the first resistance as logical "0" and the MRMEs of the second resistance as a logical "1".

DETAILED DESCRIPTION

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form only in order to avoid obscuring the invention.

Reference in this specification to "one embodiment" or "an embodiment" means that a particular feature, structure, or characteristic described in connection with the embodiment is included in at least one embodiment of the invention. The appearance of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Although the following description contains many specifics for the purposes of illustration, anyone skilled in the art will appreciate that many variations and/or alterations to said details are within the scope of the present invention. Similarly, although many of the features of the present invention are described in terms of each other, or in conjunction with each other, one skilled in the art will appreciate that many of these features can be provided independently of other features. Accordingly, this description of the invention is set forth without any loss of generality to, and without imposing limitations upon, the invention.

Figure 2:
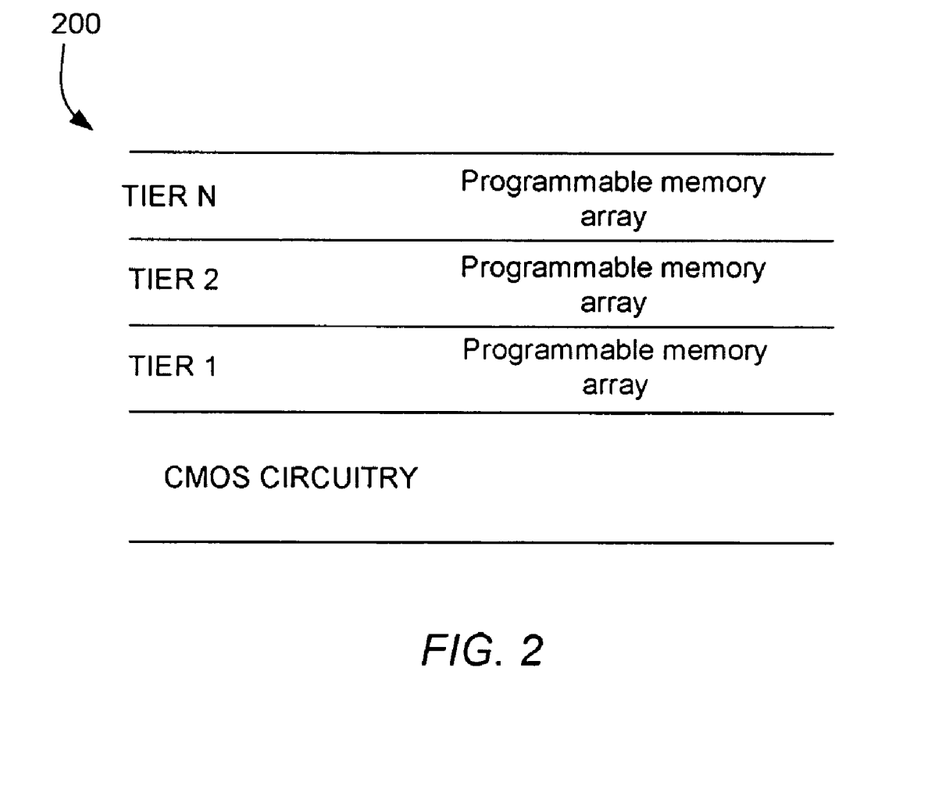
FIG. 2 shows a schematic drawing of a multi-tiered memory architecture, in accordance with one embodiment of the invention.

Referring to FIG. 2 of the drawings, there is shown an architecture for a memory device 200 in accordance with one embodiment of the invention. The device 200 is a multi-tiered device comprising a range of tiers from 1 to N. Each of tiers 1 to N comprises a programmable memory array. Each memory array comprises a plurality of magnetic storage elements defined by a magnetoresistive memory element (MRME). In one embodiment, the each MRME comprises a magnetic tunnel junction (MTJ). As will be seen, the memory device may comprise conventional complementary metal-oxide (CMOS) circuitry for reading and writing to each memory array.

Advantageously, since the memory device is a stacked device with multiple tiers of memory arrays the total memory capacity of the memory device is very high.

The memory device 200 may be field programmable or factory programmable.

In one embodiment, the memory device 200 may be programmed during fabrication as follows:

(a) During the manufacture of the device 200 data to be programmed in the device is read;

(b) The data is programmed into the device during the fabrication of the memory array within each tier by selectively forming either a magnetoresistive memory element (MRME) or an insulator at intersections between a word line (WL) and a bit line (BL) in within the memory array.

Each memory array may be fabricated using CMOS back-end processing techniques for defining structures such a MTJ using conductive insulating and magnetic materials.

Figure 3:
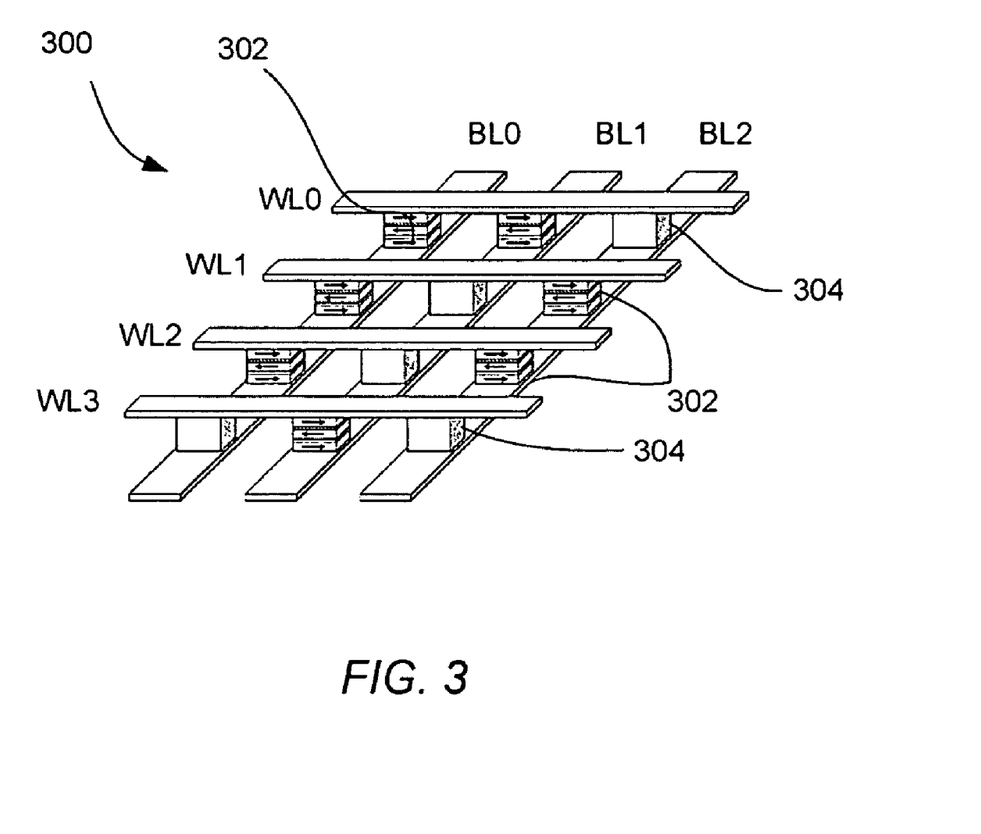
FIG. 3 shows a schematic drawing of a memory array/device, in accordance with one embodiment of the invention, wherein a bridging structure selected from one of a MRME or an insulator selectively bridges gaps between a WL and BL at intersections between the WL and the BL.

The result of the aforesaid technique is that a gap formed at each intersection of a WL and a BL in a memory array is bridged by either an insulator or a MRME e.g. a MTJ. For illustrative purposes, FIG. 3 of the drawings shows an exemplary 3×3 memory array 300 that is the result of the aforesaid technique. In FIG. 3, BL0 to BL2 indicate bit lines, whereas WL0 to WL2 indicate word lines. As will be seen, gaps between selected intersecting WLs and BLs are bridged by MRMEs e.g. MTJs. These MRMEs are indicated as 302 in FIG. 3 and will be sensed as a logical "0" by a sensing arrangement of the device 200. Moreover, gaps between selected WLs and BLs are bridged by insulators indicated as 304 in FIG. 3. The insulators 304 are sensed as a logical "1" by the sensing arrangement.

In one embodiment, each MRME may comprise a MTJ and each insulator may comprise an insulating material. First the MTJs are built using CMOS fabrication techniques. The MTJs may then be selectively left behind between the selected WLs and BLs or removed by a masking and etching sequence. Alternatively, a insulating layer/structure may be deposited and then etched at locations corresponding to where a MTJ is desired in the final memory array. MTJs can then be built in each etched location using CMOS fabrication techniques.

Figure 4:
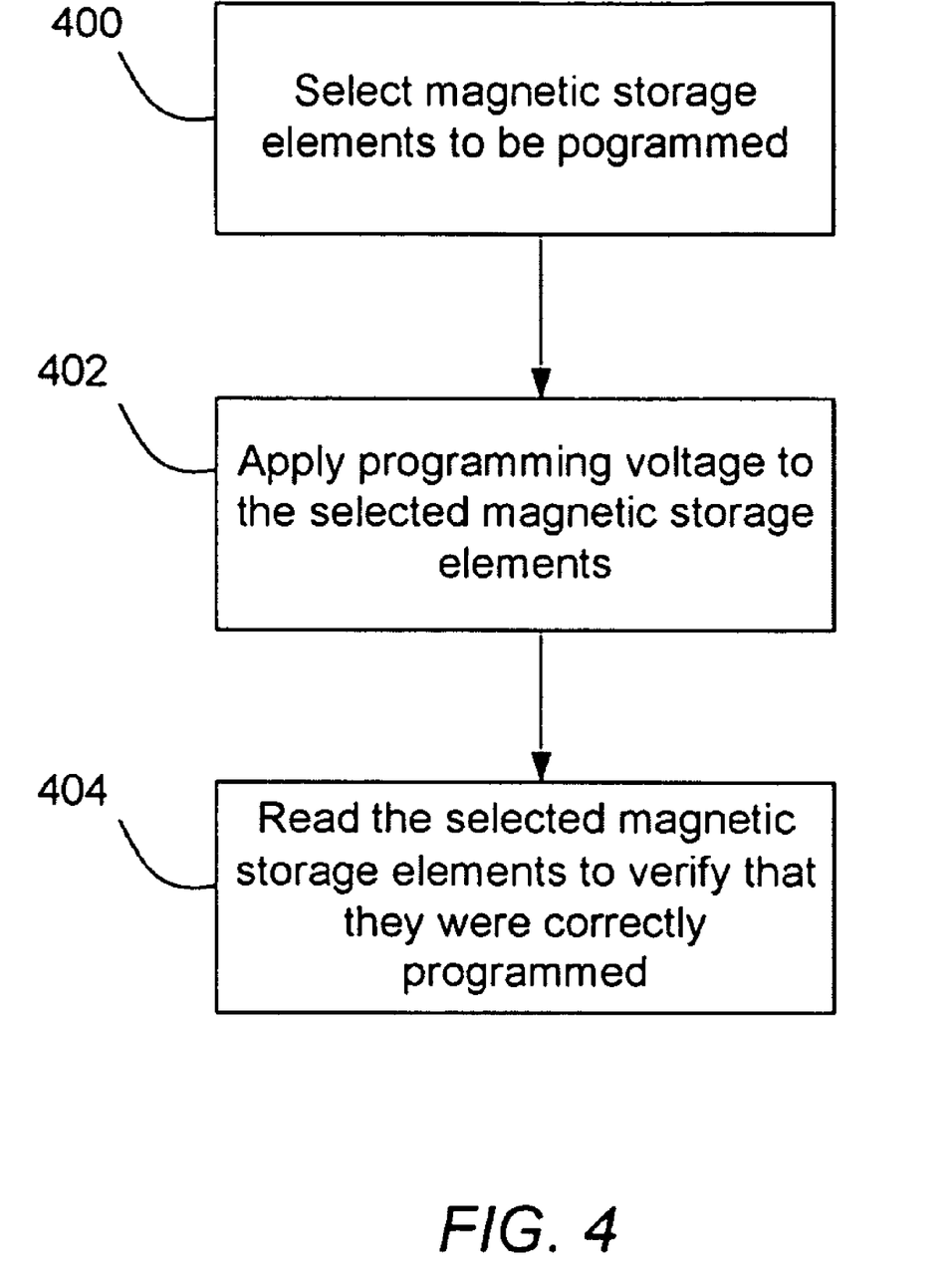
FIG. 4 shows a flowchart of a method for programming a memory device, in accordance with one embodiment of the invention.
Figure 5A:
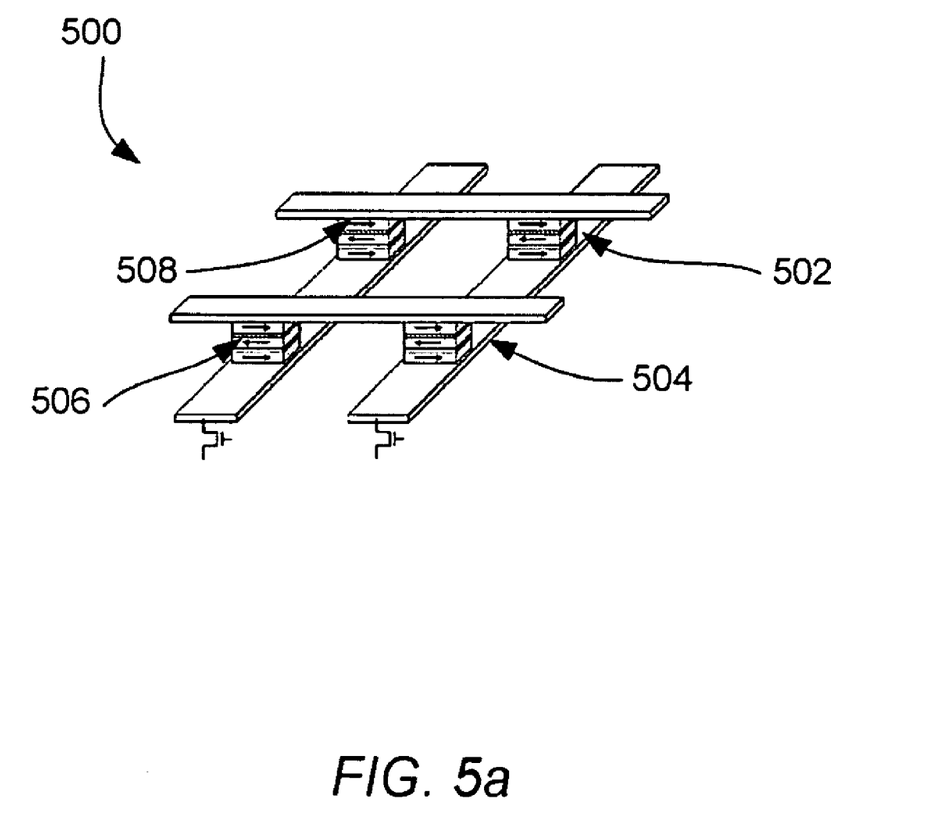
FIG. 5 illustrate the field programming method of the present invention, in accordance with one embodiment.
Figure 5B:
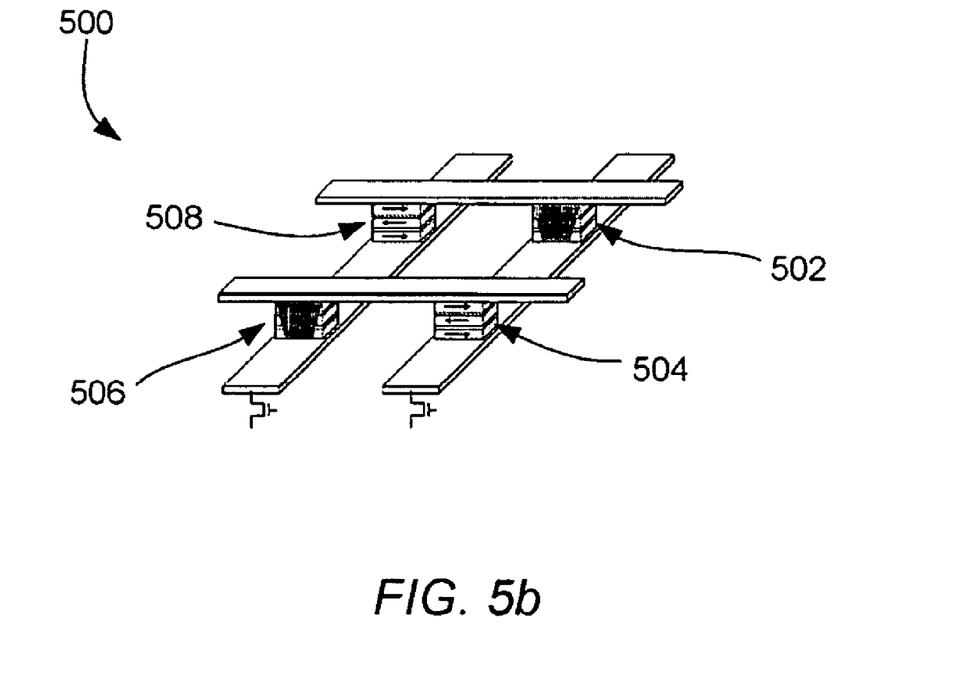

The field programming method will now be described, in accordance with one embodiment, with reference to FIGS. 4 and 5 of the drawings. The field programming method is initially performed on a magnetic memory device that includes at least one tier comprising a memory array in which a MRME is located at each intersection of a WL and a BL. To begin with the magnetic storage elements within a magnetic memory array will all be identical and will each have the same resistance. This is illustrated in FIG. 5a of the drawings. Referring to FIG. 5, a 2×2 memory array 500 includes MRMEs 502 to 508. Each MRME which may be a MTJ bridges a gap at an intersection between a WL and a BL. A resistance of each of the MRMEs will be equal to an initial value of R1. For example, R1 may be 70 KΩ. MTJs sensed to have a resistance of R1 will be taken to hold a logical value of "1". The field programming method starts at block 400 (see FIG. 4) where the magnetic storage elements e.g. MTJs to be programmed are selected based on the memory location that is to be written. For illustrative purposes, say the MTJs 502 and 508 are to be programmed with a logical value of "0". In this case, the MTJs 502 and 508 will be selected using addressing circuitry (not shown) for addressing the magnetic storage elements in the array 500. The memory locations can be simultaneously programmed 8, 16 or 32 at a time or any other number.

At block 402, programming voltage $V_P$ is applied across the selected MTJs. Referring FIG. 5b of the drawings, this is achieved by keeping the BLs at $V_p$ and turning on the transistors that respectively control the WLs to MTJs 502 and 506. The result is that the programming voltage is applied across the MTJs 502 and 506. During normal operation, an MTJ is subjected to an operating voltage $V_{op}$ of a few hundred millivolts. The voltage $V_p$ is selected so that $V_p \gg V_{op}$. For example, in one embodiment, $V_p$ may be in the range of 1 to 3V. When the programming voltage $V_p$ is applied across a MTJ for a short duration (say a few nanoseconds) the properties of the tunnel oxide layer of the MTJ changes. In particular, the tunnel oxide layer partially degrades or breaks down. This is illustrated in FIG. 5c of the drawings where the structure of the MTJs 502 and 506 can be seen to be different after programming. This break down manifests as a decrease in the resistance of the MTJ. Thus, by choosing an appropriate value for $V_p$ the resistance of an MTJ subjected to the programming voltage $V_p$ may be decreased from R1 to R2, where R2 is sufficiently less than R1 so to be sensed as a logical "0" during normal operations. In one embodiment, R2 may be 60 kΩ. Referring to FIG. 4 of the drawings, at block 404, once the selected MTJs have been programmed the selected MTJs are then read in order to verify the accuracy of the programming.

For reading, each magnetic memory element may be connected via a sense amp to a reading circuit.

Figure 6:
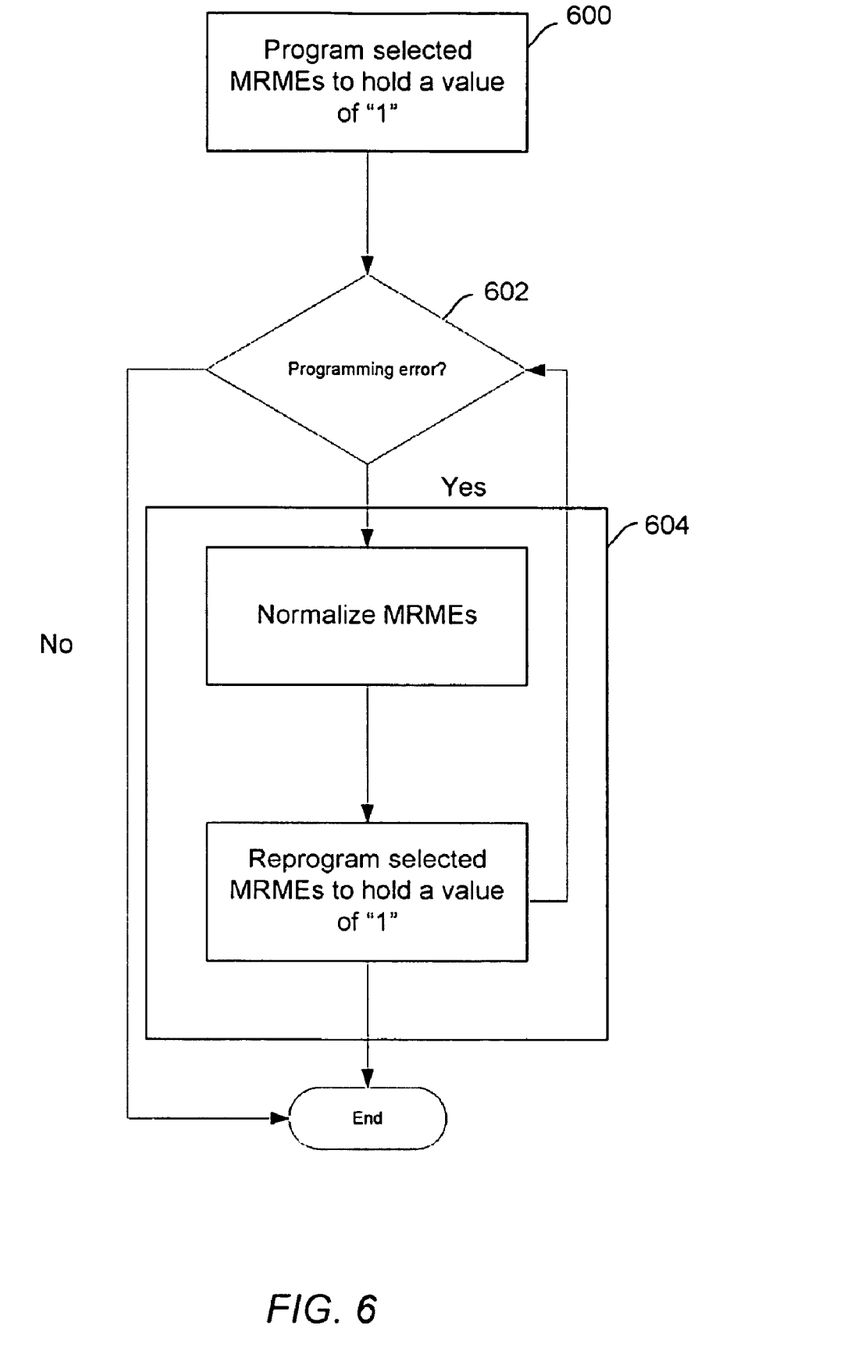
FIG. 6 illustrates how the field programming method of the present invention may be performed more than once.

In one embodiment, the field programmable method described above may be performed more than once. This is illustrated in FIG. 6 of the drawings. Referring to FIG. 6, initially all MRMEs hold a value of "1" and have a resistance of R1 which is equal to say 80 kΩ. At block 600, selected MRMEs designated to hold a value of "1" are programmed by subjecting them to the programming voltage $V_P$ (the first programming voltage) using the field programming techniques described above. This reduces the resistance of the selected MRMEs to a lower value R2, say 70 kΩ, which can be sensed as a "1". Due to say a programming error or for some other reason, it may be necessary to reprogram the memory device. Thus, at block 602 the programmed MRMEs are read to detect any programming errors. If programming errors are detected then block 604 is performed. Block 604 includes the blocks 606 and 608. At block 606 the resistance of the MRMEs is normalized to an R1 which is equal to the resistance R2. This is done by selecting the MRMEs with a resistance of R1 and subjecting them to an erasing voltage which is equal to the programming volt $V_P$. At block 608, the MRMEs that are to hold the value "1" programmed as follows. The MRMEs are selected and then subjected to a second programming voltage to decrease their resistance to a new R2 that can be sensed as a "1". By way of example, R2 may be 60 kΩ. After performing the block 604, the programmed MRMEs are checked for errors at block 602. If no errors are detected at block 602 then the field programming method is terminated. The processing block may be repeated several times. Each time the MRMEs are normalized to resistance of R1 and then selected MRMEs are programmed by subjecting them to the programming voltage to cause them to have a resistance of R2.

Figure 7:
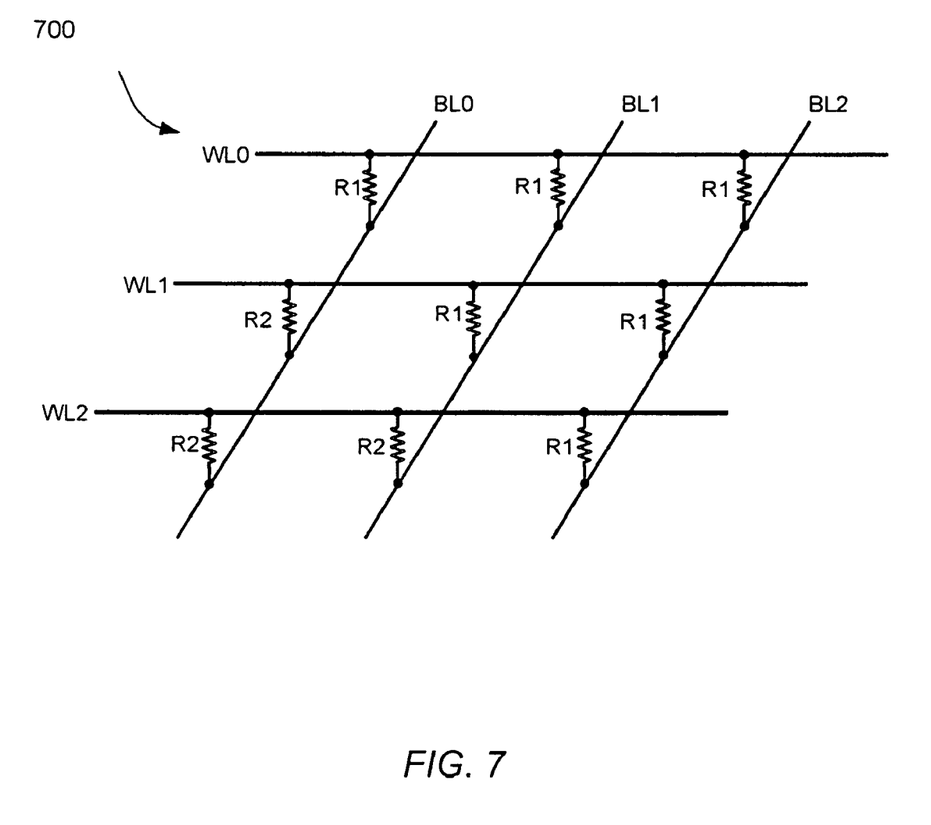
FIG. 7 shows a schematic drawing of a memory array/device, in accordance with one embodiment of the invention, comprising a plurality of MRMEs each to store data wherein the memory device is programmed with data by selectively having the resistance of MRMEs altered to one of a first resistance and a second resistance.

FIG. 7 of the drawings shows an exemplary 3×3 memory array 700 that is the result of the aforesaid field programming technique. In FIG. 7, BL0 to BL2 indicate bit lines, whereas WL0 to WL2 indicate word lines. As will be seen, gaps between all intersecting WLs and BLs are bridged by MRMEs e.g. MTJs. As indicated selected MRMEs may have a resistance of R1 which will be sensed as a logical "1" by a sensing arrangement, whereas selected MRMEs will have a resistance of R2 which will be sensed as a logical "0" by the sensing arrangement. As noted above, in one embodiment, the sensing arrangement may comprise a sense amp connected to each BL. The sense amps may then be connected to read circuitry.

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

The invention claimed is:

1. A method for fabricating a magnetic memory device comprising magnetoresistive memory elements as storage elements, the method comprising:

reading data to be programmed into the magnetic memory device; and programming the data into the magnetic memory device by selectively forming one of a magnetoresistive memory element (MRME) and an insulator at intersections between a word line (WL) and a bit line (BL), wherein the MRME comprises a magnetic tunnel junction (MTJ), and wherein forming the insulator of the selected MTJs comprises applying a predefined first programming voltage across the selected MTJs selected to cause at least a partial breakdown of each selected MTJ which partial breakdown is sufficient to be sensed as a lower resistance of the MTJ relative to an MTJ not subjected to the predefined first programming voltage.

2. A method for programming a magnetic memory device comprising magnetoresistive memory elements as storage elements, the method comprising:

reading data to be programmed into the magnetic memory device; and writing the data into the magnetic memory device by altering the resistance of selected magnetoresistive memory elements (MRMEs), wherein the MRMEs each comprise a magnetic tunnel junction (MTJ), and wherein altering the resistance of the selected MTJs comprises applying a predefined first programming voltage across the selected MTJs selected to cause at least a partial breakdown of each selected MTJ which partial breakdown is sufficient to be sensed as a lower resistance of the MTJ relative to an MTJ not subjected to the predefined first programming voltage.

3. The method of claim 2, further comprising (a) erasing the magnetic memory device by an applying erasing voltage across selected MTJs in the device which erasing voltage causes the resistance across each MTJ to be normalized to a common value; and (b) based on data to be programmed into the memory device, applying a predefined second programming voltage across selected MTJs to cause at least a partial breakdown of each selected MTJ which partial breakdown is sufficient to be sensed as a lower resistance of the MTJ relative the MTJs not subjected to the predefined second programming voltage.

4. The method of claim 3, further comprising repeating steps (a) and (b) more than once.

5. A magnetic memory device, comprising:

at least one tier structure comprising by a plurality of word lines (WLs) disposed in a first direction;

a plurality of bit lines (BLs) spaced from the WLs and disposed in a second direction; and a bridging structure to bridge a gap between a WL and a BL where they intersect, wherein the bridging structure selectively comprises one of a magnetoresistive memory element (MRME) and an insulator according to data stored in the tier structure; and a sensing arrangement to sense a presence of a MRME at an intersection of a WL and a BL as a logical "0", wherein the MRMEs each comprise a magnetic tunnel junction (MTJ), and wherein altering the resistance of the selected MTJs comprises applying a predefined first programming voltage across the selected MTJs selected to cause at least a partial breakdown of each selected MTJ which partial breakdown is sufficient to be sensed as a lower resistance of the MTJ relative to an MTJ not subjected to the predefined first programming voltage.

6. The magnetic memory device of claim 5, further comprising a plurality of the tier structures.

7. The magnetic memory device of claim 5, wherein the sensing arrangement senses a presence of an insulator at an intersection of a WL and a BL as a logical "1".

8. A magnetic memory device, comprising:

at least one tier structure comprising by a plurality of word lines (WLs) disposed in a first direction;

a plurality of bit lines (BLs) spaced from the WLs and disposed in a second direction; and a bridging stricture to bridge a gap between a WL and a BL where they intersect, wherein the bridging structure selectively comprises one of a magnetoresistive memory element (MRME) of a first resistance and a MRME of a second resistance; and a sensing arrangement to sense a presence of a MRME of the first resistance at an intersection of a WL and a BL as a logical "0", wherein the MRMEs each comprise a magnetic tunnel junction (MTJ), and wherein altering the resistance of the selected MTJs comprises applying a predefined first programming voltage across the selected MTJs selected to cause at least a partial breakdown of each selected MTJ which partial breakdown is sufficient to be sensed as a lower resistance of the MTJ relative to an MTJ not subjected to the predefined first programming, voltage.

9. The magnetic memory device of claim 8, further comprising a plurality of the tier structures.

10. The magnetic memory device of claim 8, wherein the sensing arrangement senses a presence of an MRME of the second resistance at an intersection of a WL and a BL as a logical "1".

* * * * *